(12) United States Patent
Benware

(10) Patent No.: US 6,972,592 B2
(45) Date of Patent: Dec. 6, 2005

(54) SELF-TIMED SCAN CIRCUIT FOR ASIC FAULT TESTING

(75) Inventor: Robert Benware, Ft. Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 114 days.

(21) Appl. No.: 10/722,686

(22) Filed: Nov. 24, 2003

(65) Prior Publication Data
US 2005/0138511 A1 Jun. 23, 2005

(51) Int. Cl.⁷ .................................. H03K 19/173
(52) U.S. Cl. ..................... 326/38; 326/16; 714/726
(58) Field of Search ................ 326/37–41, 16, 326/46; 714/725–727

(56) References Cited

U.S. PATENT DOCUMENTS

| | | | | |
|---|---|---|---|---|
| 5,570,375 A | * | 10/1996 | Tsai et al. ................ | 714/727 |
| 5,574,731 A | * | 11/1996 | Qureshi .................. | 714/726 |
| 6,266,801 B1 | * | 7/2001 | Jin ........................ | 716/8 |
| 6,412,098 B1 | * | 6/2002 | Jin ........................ | 716/4 |
| 6,515,483 B1 | * | 2/2003 | Porterfield ............. | 324/529 |
| 6,671,860 B2 | * | 12/2003 | Langford, II ........... | 716/2 |
| 6,738,939 B2 | * | 5/2004 | Udawatta et al. ....... | 714/726 |
| 6,766,487 B2 | * | 7/2004 | Saxena et al. .......... | 714/726 |
| 2002/0013918 A1 | * | 1/2002 | Swoboda et al. ........ | 714/30 |
| 2004/0044937 A1 | * | 3/2004 | Dubey ................... | 714/727 |
| 2004/0153801 A1 | * | 8/2004 | Kayukawa et al. ...... | 714/30 |

* cited by examiner

*Primary Examiner*—Don Le
(74) *Attorney, Agent, or Firm*—Fitch, Even, Tabin & Flannery

(57) ABSTRACT

A self-timed scan circuit includes a multiplexer for selecting either a data input or a test input in response to an internal test enable signal and for generating a multiplexed output; a latch coupled to the multiplexer for generating a latched output in response to a next clock pulse; and a timing control circuit for generating the internal test enable signal in response to a global test enable signal wherein the internal test enable signal is set to logic one when the global test enable signal is set to logic one and wherein the internal test enable signal is set to logic zero in response to the next clock pulse.

8 Claims, 4 Drawing Sheets

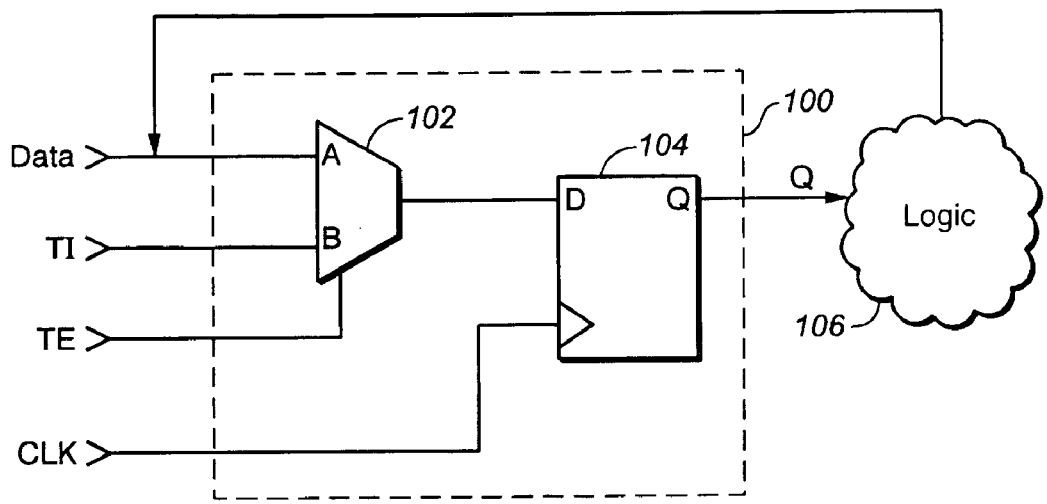
FIG._1 (PRIOR ART)
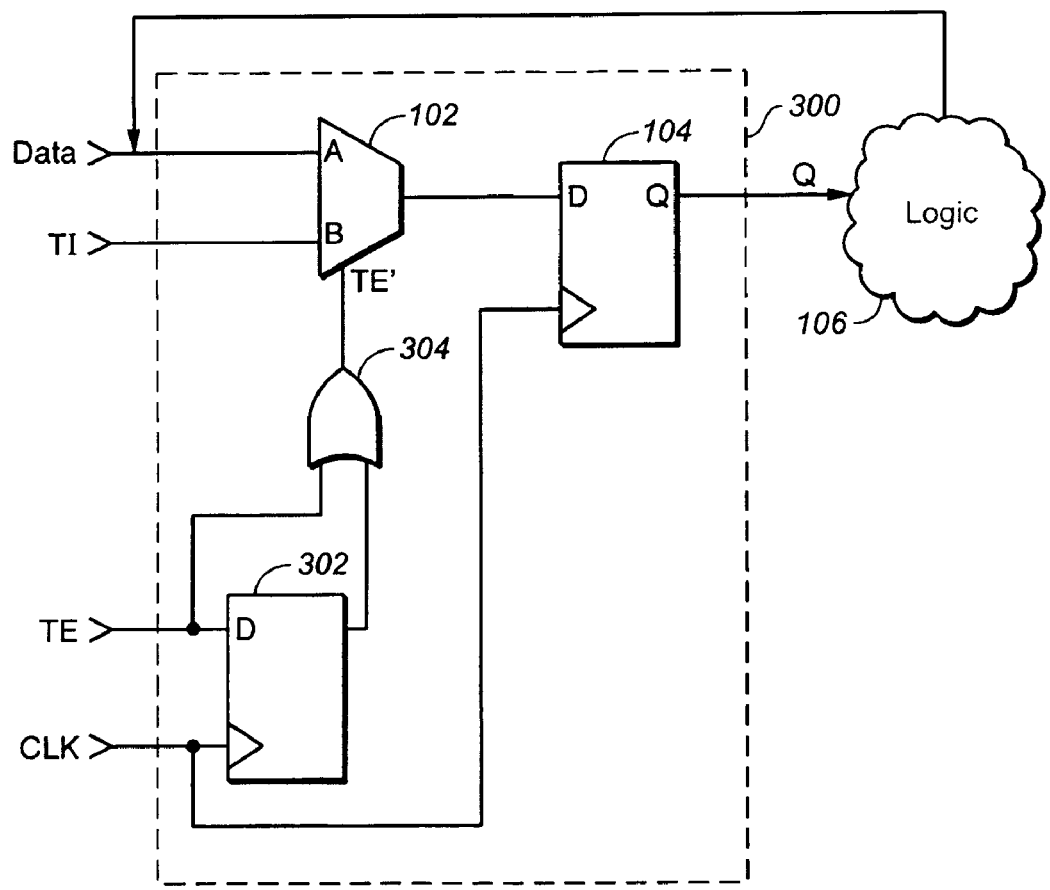
FIG._3

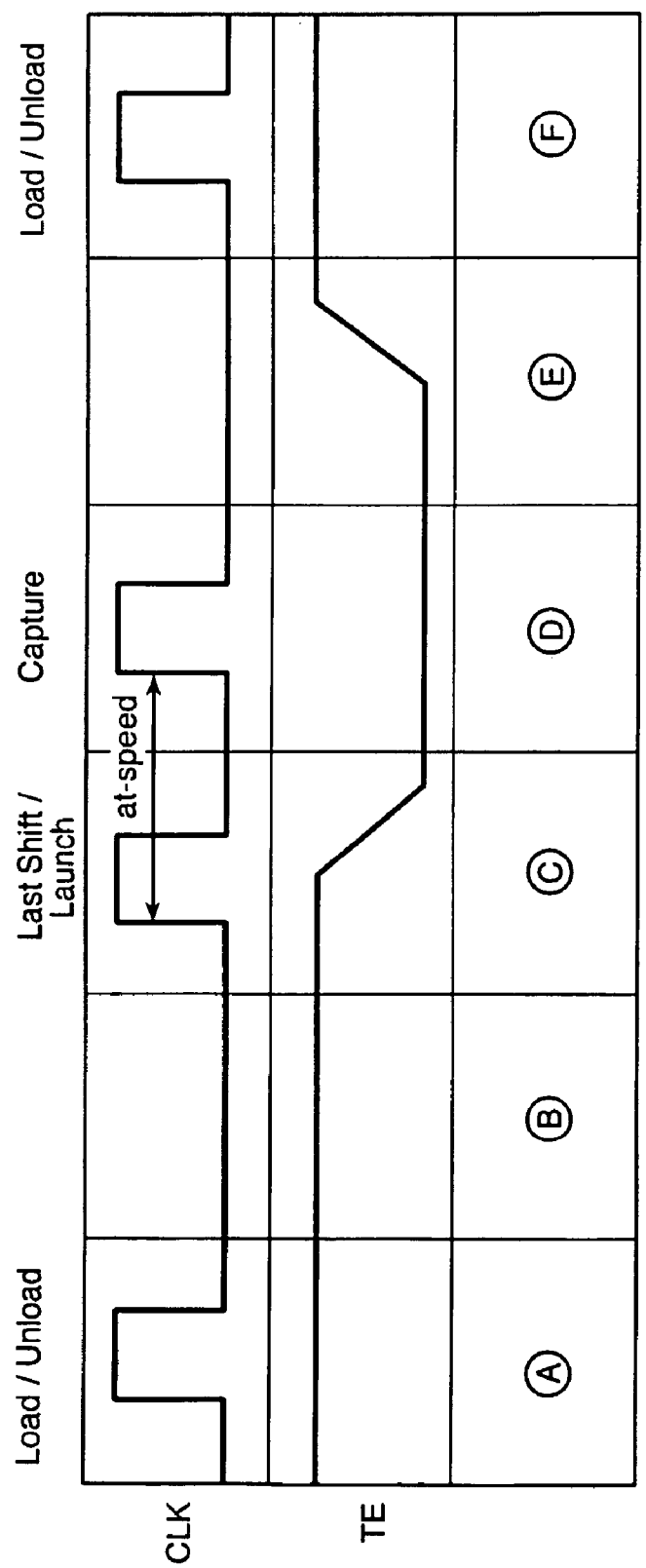
FIG._2 (PRIOR ART)

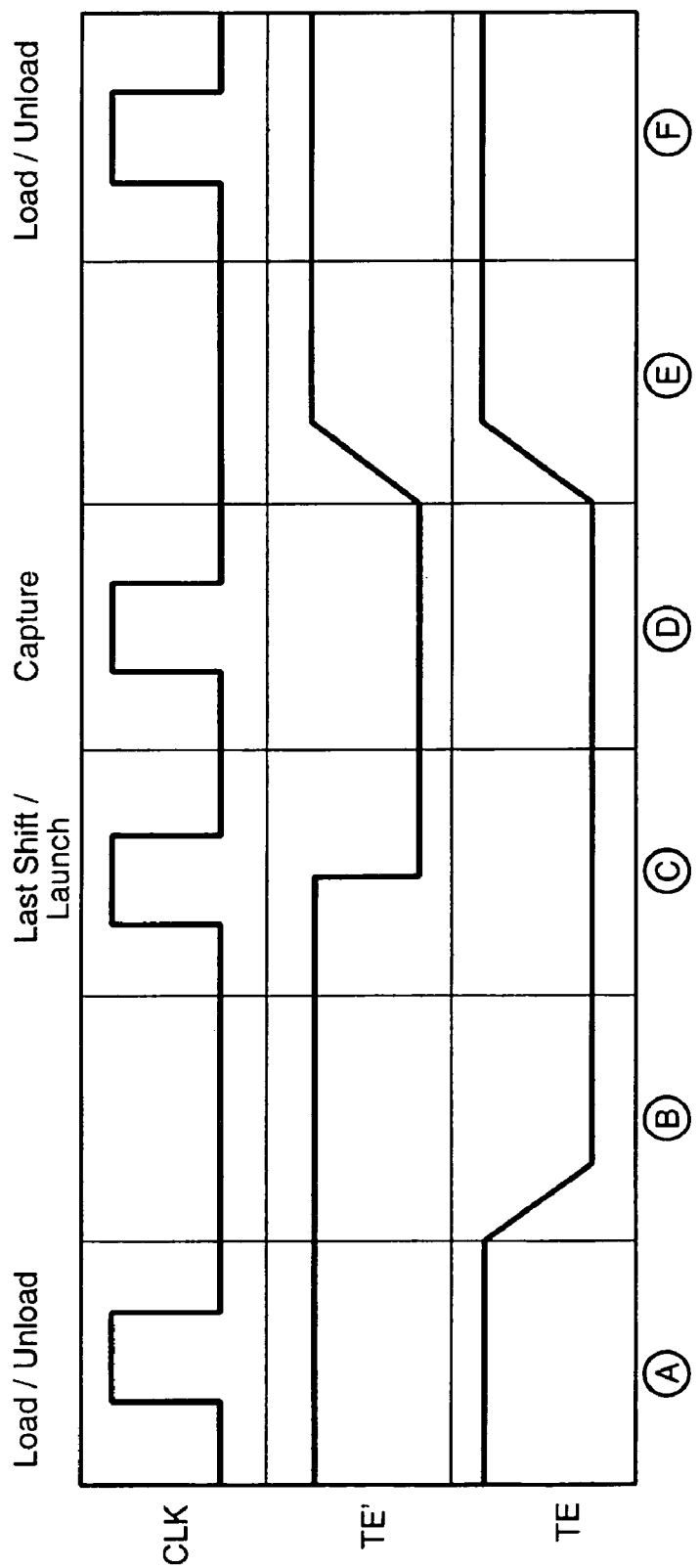
FIG._4

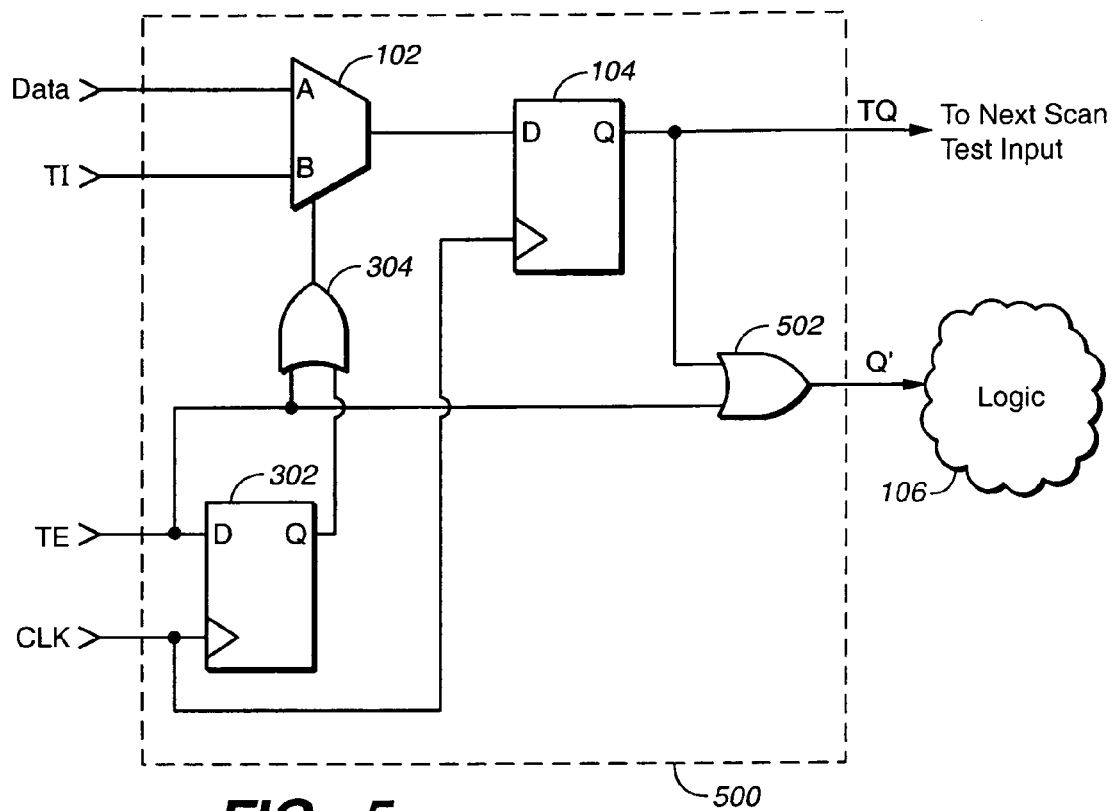
FIG._5
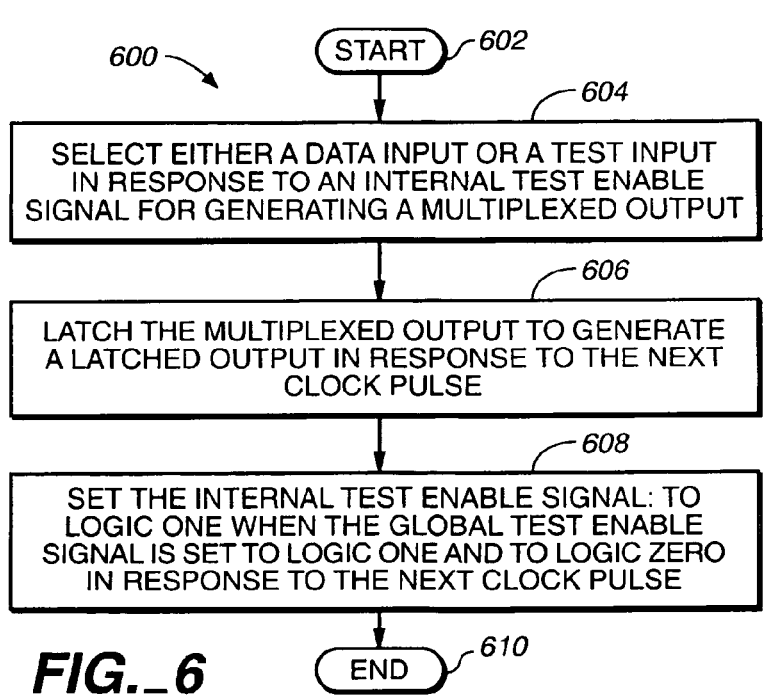
FIG._6

SELF-TIMED SCAN CIRCUIT FOR ASIC FAULT TESTING

BACKGROUND OF THE INVENTION

1. Field of the Invention

The present invention is directed to the testing of integrated circuit devices. More specifically, but without limitation thereto, the present invention is directed to a method of testing integrated circuits that include synchronously clocked elements.

2. Description of Related Art

Modern electronics systems have increased dramatically in circuit density. For example, the densities of integrated circuits have increased from a few hundred transistors per chip in the 1960's to several million transistors per chip in integrated circuits manufactured today. Integrated circuit packaging density has increased from the previous relatively low density dual in-line package (DIP) having a typical pin count of 8 to 40 pins and a pin spacing of 0.1 inch to the current fine-pitch technology (FPT), tape-automated bonding (TAB), and multi-chip modules (MCMs) that provide hundreds of pins in relatively small packages. Conductive trace spacing and trace width on printed circuit boards has also decreased, so that a large number of signals may be routed in a small space. Multi-layer printed circuit boards and single and double-sided surface mount techniques are combined with high levels of integration and high-density integrated circuit packaging techniques to provide extremely dense electronic systems.

As the density of electronic devices increases, device testing becomes increasingly difficult. Traditional test methods include testing circuit board assemblies with testers having a large number of spring-loaded contact pins that make contact with test points on a printed circuit board. Modern fine-pitch technology packages, multi-layer printed circuit boards, and double-sided surface mount techniques frustrate attempts to test high density electronic systems with traditional test methods.

Application specific integrated circuits (ASICs) routinely achieve densities of up to 100,000 gates per chip, which presents an especially difficult testing challenge. ASICs are typically designed by combining pre-defined, standard functional blocks called core cells from a variety of sources with discrete logic to perform a desired function or group of functions. Although standard test vectors or test strategies may be supplied with the core cells, their internal connections to one another inside the ASIC are frequently inaccessible from the pins of the ASIC, rendering the standard tests unusable and complicating the testing procedure.

A common technique used to gain access to core cells inside an ASIC is known as MUX isolation. In MUX isolation, a test mode or test signal is provided that changes the function of certain pins of the ASIC in the test mode. Multiplexers are used in the test mode to connect the ordinarily inaccessible signals of the core cells to the pins of the ASIC that are not needed during the test mode. When the test signal or test mode is removed, the ASIC pins revert to their normal function. The MUX isolation technique is not always practical or possible, for example, when there are more signals at the periphery of a core cell than there are pins on the ASIC that contains the core cell.

Another technique used for testing ASICs is full-scan design, in which every flip-flop, or flop, of a logic circuit has a multiplexer placed at its data input, so that when a test mode signal is applied to the control input of the multiplexers, all the flip-flops are chained together into a shift register, commonly called a scan chain. The scan chain is then used to clock in test patterns (stimuli) and to clock out the test results (responses).

SUMMARY OF THE INVENTION

In one aspect of the present invention, a self-timed scan circuit includes:
 a multiplexer for selecting either a data input or a test input in response to an internal test enable signal and for generating a multiplexed output;
 a latch coupled to the multiplexer for generating a latched output in response to a next clock pulse; and
 a timing control circuit for generating the internal test enable signal in response to a global test enable signal wherein the internal test enable signal is set to logic one when the global test enable signal is set to logic one and wherein the internal test enable signal is set to logic zero in response to the next clock pulse.

In another aspect of the present invention, a method of launch-from-shift delay testing includes steps of:
 selecting either a data input or a test input in response to an internal test enable signal for generating a multiplexed output;
 latching the multiplexed output to generate a latched output in response to a next clock pulse; and
 generating the internal test enable signal in response to a global test enable signal wherein the internal test enable signal is set to logic one when the global test enable signal is set to logic one and wherein the internal test enable signal is set to logic zero in response to the next clock pulse.

BRIEF DESCRIPTION OF THE DRAWINGS

The present invention is illustrated by way of example and not limitation in the accompanying figures, in which like references indicate similar elements throughout the several views of the drawings, and in which:
 FIG. 1 illustrates a typical scan circuit of the prior art;
 FIG. 2 illustrates a timing diagram for the scan circuit of FIG. 1;
 FIG. 3 illustrates a self-timed scan circuit according to an embodiment of the present invention;
 FIG. 4 illustrates a timing diagram for the self-timed scan circuit of FIG. 3;
 FIG. 5 illustrates a self-timed scan circuit with low power consumption according to an embodiment of the present invention; and
 FIG. 6 illustrates a timing diagram for the self-timed scan circuit of FIG. 5.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

Delay-related effects in random logic are becoming increasingly significant in the overall defect density in semiconductor manufacturing as a result of increased operating frequencies and increased backend metal layers. This trend in delay defect density creates an additional need to test for and reject die having an inadequate speed performance due to delay-related defects. Screening for delay defects has traditionally been done through at-speed functional testing of the die. However, due to an increased ratio of internal nodes to external control and observation points, that is, primary inputs and outputs of the die, it becomes increasingly difficult to create functional test patterns in a time and cost efficient manner. A commonly used method for increasing the test capability of complex integrated circuit designs uses scan chains.

Scan testing is an effective alternative to functional testing for delay-related defects. One form of scan testing is commonly known as the launch-from-capture or broadside method. In the launch-from-capture method, a double sequential pattern is used to set up a transition and then execute a fast launch and capture event to test the transition. The advantage of this method is that the global test enable signal TE that changes the mode of the scan flip-flop from test mode to functional mode is allowed to transition relatively slowly before the fast launch and capture. On the other hand, the launch-from-capture method also includes the disadvantages of inadequate fault coverage and excessively large test pattern sets.

An alternative method to the launch-from-capture method is known as launch-from-shift. In the launch-from-shift method, the transition is set up directly by shifting data into the scan chains. The launch event occurs on the last data shift, which is directly followed by a fast capture event. The launch-from-shift method is capable of yielding much higher fault coverage and a significantly smaller test pattern set size than the launch-from-capture method.

A disadvantage of the launch-from-shift method of delay testing is that the global test enable signal must transition before the capture clock event occurs, so that the test data may be captured on the next clock pulse. Consequently, the global test enable signal must satisfy the same timing requirements as the clock signal. During timing closure, the equivalent of two clocks, the clock signal and the global test enable signal, must be considered, which can dramatically increase the design cycle time. In some cases, timing closure is not possible without reducing fault coverage or reducing the test frequency, either of which would erode the effectiveness of the actual test.

FIG. 1 illustrates a typical scan circuit 100 of the prior art. Shown in FIG. 1 are a 2-to-1 logic multiplexer 102, a flip-flop 104, and a logic cloud 106.

In FIG. 1, the output of the logic multiplexer 102 is connected to the data input of the flip-flop 104. The flip-flop 104 is a typical latch used in synchronous, or clocked, integrated circuit designs. The scan circuit 100 has four inputs: DATA, TI, TE and CLK. The output Q of the flip-flop 104 is generated in either the test mode or the functional mode as follows.

In the test mode, the global test enable signal TE is set equal to logic one, which is typically mapped to the voltage rail or the higher of the voltage levels used to represent logical states one and zero in an integrated circuit. The logic multiplexer 102 selects the logical value of the test input signal TI in response to the global test enable signal TE and propagates the logical value of the test input signal TI to the data input of the flip-flop 104. The flip-flop 104 latches the logical value of the test input signal TI in response to the next clock pulse at the CLK input and propagates the logical value of the test input signal TI to the output Q of the flip-flop 104 and into the logic cloud 106. The global test enable signal TE is then switched to logic zero, and the logic multiplexer 102 selects the logical value of the data input signal DATA and propagates the logical value of the data input signal DATA to the data input of the flip-flop 104. The flip-flop 104 latches the logical value of the data input signal DATA in response to the next clock pulse at the CLK input of the flip-flop 104 and propagates the logical value of the data input signal DATA to the output Q of the flip-flop 104.

In the functional mode, the global test enable signal TE is set equal to logic zero. The logic multiplexer 102 selects the logical value of the data input signal DATA in response to the global test enable signal TE and propagates the logical value of the data input signal DATA to the data input of the flip-flop 104. The flip-flop 104 latches the logical value of the data input signal DATA in response to the next clock pulse at the CLK input of the flip-flop 104 and propagates the logical value of the data input signal DATA to the output Q of the flip-flop 104 and into the logic cloud 106.

In the launch-from-shift method of delay fault testing, the global test enable signal TE must be equal to logic one to launch the test input signal TI into the logic cloud 106. After the test input signal TI has propagated through the logic cloud 106, the resultant value resides on the DATA input. To capture the test result, the global test enable signal TE must be set equal to logic zero before the next clock pulse is received at the CLK input of the flip-flop 104. The required timing relationship between the clock pulse and the global test enable signal TE for a launch-from-shift delay test is shown in FIG. 2.

FIG. 2 illustrates a timing diagram for the scan circuit 100 of FIG. 1. Shown in FIG. 2 are six cycles of a launch-from-shift test sequence labeled "A", "B", "C", "D", "E" and "F".

In cycle "A", data is being shifted in and out of the scan chains. To shift data through the scan chains, the global test enable signal TE is required to be set equal to one, as shown in cycle "A".

In cycle "B", no clock pulses occur. In previous methods of launch-from-shift delay testing, cycle "B" is unused in the test sequence.

In cycle "C", a clock pulse is generated. The clock pulse is received by the flip-flop 104 while the global test enable signal TE has a logical value of one, initiating a launch-from-shift event. The global test enable signal TE must then transition from logic one to logic zero to capture the resultant test data before the next clock pulse occurs at the test clock frequency, that is, "at-speed".

In cycle "D", the resultant data is captured by the flip-flop 104 on the next clock pulse.

In cycle "E", no clock pulses occur. This period is used for switching the global test enable signal TE from logic zero to logic one to reset the scan circuit 100 for the next launch-from-shift event.

In cycle "F", the test sequence is completed, and may be repeated for the next launch-from-shift event. Cycle "F" is identical to cycle "A".

In a self-timed scan circuit of the present invention, a timing control circuit generates an internal test enable signal in response to the global test enable signal TE that controls the timing of the launch-from-shift event from inside the scan circuit.

In one aspect of the present invention, a self-timed scan circuit includes:
  a multiplexer for selecting either a data input or a test input in response to an internal test enable signal and for generating a multiplexed output;
  a latch coupled to the multiplexer for generating a latched output in response to a next clock pulse; and
  a timing control circuit for generating the internal test enable signal in response to a global test enable signal wherein the internal test enable signal is set to logic one when the global test enable signal is set to logic one and wherein the internal test enable signal is set to logic zero in response to the next clock pulse.

FIG. 3 illustrates a self-timed scan circuit 300 according to an embodiment of the present invention. Shown in FIG. 3 are a 2-to-1 logic multiplexer 102, a flip-flop 104, a logic cloud 106, a latch 302, and an OR-gate 304.

In FIG. 3, the output of the logic multiplexer 102 is connected to the data input of the flip-flop 104 as in the example of FIG. 1. The self-timed scan circuit 300 also has the same four inputs as the example of FIG. 1: DATA, TI, TE and CLK. In FIG. 3, however, a timing control circuit is included in the self-timed scan circuit 300 to generate the internal test enable signal TE'. In the example of FIG. 3, the timing control circuit constitutes the latch 302 and the OR-gate 304, however, other circuit elements may be used for the timing control circuit to generate the internal test enable signal TE' according to well known techniques to practice the present invention within the scope of the appended claims. The internal test enable signal TE' is used to control the logic multiplexer 102, and the output Q of the flip-flop 104 is generated according to the test mode or the functional mode as follows.

In the test mode, the global test enable signal TE is set equal to logic one. The timing control circuit sets the internal test enable signal TE' to logic one through the OR-gate 304 when the global test enable signal TE is set equal to logic one. The latch 302 latches the logical value of the global test enable signal TE on the next clock pulse so that the global test enable signal TE may be set to logic zero asynchronously in preparation for the launch-from-shift event while the value of the internal test enable signal TE' is maintained at logic one through the OR-gate 304. The logic multiplexer 102 selects the logical value of the test input signal TI in response to the internal test enable signal TE' and propagates the logical value of the test input signal TI to the data input of the flip-flop 104. The flip-flop 104 latches the logical value of the test input signal TI in response to the next clock pulse at the CLK input of the flip-flop 104 and propagates the logical value of the test input signal TI to the output Q of the flip-flop 104 and into the logic cloud 106. Because the global test enable signal TE was set to logic zero before the clock pulse in which the logical value of the test input signal TI was latched by the flip-flop 104, a logic zero is propagated to the output Q of the latch 302 in response to the same clock pulse, setting the value of the internal test enable signal TE' to logic zero before the next clock pulse. The flip-flop 104 latches the logical value of the data input signal DATA on the next clock pulse and propagates the logical value of the data input signal DATA to the Q output of the flip-flop 104.

In the functional mode, the test enable signal TE is set equal to logic zero. The logic multiplexer 102 selects the logical value of the data input signal DATA in response to the test enable signal TE and propagates the logical value of the data input signal DATA to the data input of the flip-flop 104. The flip-flop 104 latches the logical value of the data input signal DATA in response to the next clock pulse at the CLK input of the flip-flop 104, and the logical value of the data input signal DATA is propagated to the output Q of the flip-flop 104 as in the example of FIG. 1.

The timing control circuit in the self-timed scan circuit 300 of FIG. 3 advantageously controls the timing of the internal test signal TE' so that the critical transition between logic one and logic zero is performed before the clock pulse in which the resultant data is latched by the flip-flop 104, while the transition of the global test signal TE may be performed asynchronously without the critical constraints required by the scan circuit 100 of FIG. 1. The timing relationship between the clock pulse and the test enable signal TE for a launch-from-shift delay test using the self-timed scan circuit 300 of FIG. 3 is shown in FIG. 4.

FIG. 4 illustrates a timing diagram for the self-timed scan circuit 300 of FIG. 3. Shown in FIG. 4 are six cycles of a launch-from-shift test sequence labeled "A", "B", "C", "D", "E" and "F".

In cycle "A", data is being shifted in and out of the scan chains. To shift data through the scan chains, the global test enable signal TE is required to be set equal to one, as shown in cycle "A". The OR-gate 304 ensures that the internal test enable signal TE' is set to logic one when the global test enable signal TE is set equal to logic one.

In cycle "B", the global test enable signal TE is switched asynchronously to logic zero before the high-speed launch and capture clock cycles, while the latch 302 ensures that the internal test enable signal TE' remains set to logic one.

In cycle "C", a clock pulse is received while the internal test enable signal TE' has a logical value of one, initiating a launch-from-shift event. The same clock pulse causes the logic zero of the global test enable signal TE to be propagated to the output Q of the latch 302, which sets the internal test enable signal TE' to logic zero immediately after the latch 302 has latched the logical value of the test input TI.

In cycle "D", the internal test enable signal TE' has a logical value of zero, and the resultant data on the DATA input of the logic multiplexer 102 is captured by the flip-flop 104 on the next clock pulse.

In cycle "E", the global test enable signal TE is reset from logic zero to logic one for the next launch-from-shift event. The transition of the global test enable signal TE from logic zero to logic one immediately propagates to the internal test enable signal TE' through the OR-gate 304 without requiring any additional clock pulses, so that the self-timed scan circuit 300 is ready to shift out the test data on the next clock pulse.

In cycle "F", the test sequence is completed, and may be repeated for the next launch-from-shift event. Cycle "F" is identical to cycle "A".

FIG. 5 illustrates a self-timed scan circuit 500 for low power consumption according to an embodiment of the present invention. Shown in FIG. 5 are a 2-to-1 logic multiplexer 102, a flip-flop 104, a logic cloud 106, a latch 302, and OR-gates 304 and 502.

The description of the self-timed scan circuit 500 for low power consumption in FIG. 5 is identical to the self-timed scan circuit 300 in FIG. 3 in all respects except that the Q output of the flip-flop 104 is used as a test output TQ, and the OR-gate 502 is included in the timing control circuit to generate the low power output signal Q'. The low power output signal Q' is connected to the logic cloud 106, while the test output TQ is connected to the test input TI of the subsequent scan circuit in the scan chain.

In the test mode, the description of the test output TQ is the same as that for the output Q in FIG. 3. The low power output signal Q' has a value of logic one during the load/unload phase of the test sequence to reduce the power consumed during the scan shift operation. The reduced power consumption advantageously results in faster loading and unloading of the scan chains.

In the functional mode, the description of the low power output signal Q' is the same as that for the output Q in FIG. 3.

In another aspect of the present invention, a method of launch-from-shift delay testing includes steps of:

selecting either a data input or a test input in response to an internal test enable signal for generating a multiplexed output;

latching the multiplexed output to generate a latched output in response to a next clock pulse; and generating the internal test enable signal in response to a global test enable signal wherein the internal test enable signal is set to logic one when the global test enable signal is set to logic one and wherein the internal test enable signal is set to logic zero in response to the next clock pulse.

FIG. 6 illustrates a flow chart 600 for a method of launch-and-shift delay testing according to an embodiment of the present invention.

Step 602 is the entry point of the flow chart 200.

In step 604, either a data input or a test input is selected in response to an internal test enable signal for generating a multiplexed output, for example, by the 2-to-1 multiplexer 102.

In step 606, the multiplexed output is latched to generate a latched output in response to the next clock pulse, for example, by the flip-flop 104.

In step 608, the internal test enable signal is generated in response to the global test enable signal. The internal test enable signal is set to logic one when the global test enable signal is set to logic one, and the internal test enable signal is set to logic zero in response to the next clock pulse. The internal test enable signal may be generated, for example, by the timing control circuit including the latch 302 and the OR-gate 304 shown in FIG. 3.

Step 610 is the exit point of the flow chart 600.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A self-timed scan circuit comprising:

a multiplexer for selecting either a data input or a test input in response to an internal test enable signal and for generating a multiplexed output;

a latch coupled to the multiplexer for generating a latched output in response to a next clock pulse; and a timing control circuit for generating the internal test enable signal in response to a global test enable signal wherein the internal test enable signal is set to logic one when the global test enable signal is set to logic one and wherein the internal test enable signal is set to logic zero in response to the next clock pulse if the global test enable signal is set to logic zero before the next clock pulse.

2. The self-timed scan circuit of claim 1 wherein the timing control circuit comprises a low power output that is set to logic one when the global test enable signal is set to logic one and wherein the low power output is identical to the latched output while the global test enable signal has a value equal to logic zero.

3. The self-timed scan circuit of claim 1 wherein the timing control circuit comprises a latch and an OR-gate.

4. The self-timed scan circuit of claim 1 wherein the latch is a flip-flop.

5. The self-timed scan circuit of claim 1 wherein the global test enable signal is set to logic one asynchronously so that a logical value of the test input is latched in response to the next clock pulse.

6. A method of launch-from-shift delay testing comprising steps of:

selecting either a data input or a test input in response to an internal test enable signal for generating a multiplexed output;

latching the multiplexed output to generate a latched output in response to a next clock pulse; and generating the internal test enable signal in response to a global test enable signal wherein the internal test enable signal is set to logic one when the global test enable signal is set to logic one and wherein the internal test enable signal is set to logic zero in response to the next clock pulse if the global test enable signal is set to logic zero before the next clock pulse.

7. The method of claim 6 further comprising generating a low power consumption output that is set to logic one when the global test enable signal is set to logic one and is identical to the latched output while the global test enable signal has a value equal to logic zero.

8. The method of claim 6 further comprising setting the global test enable signal to logic one asynchronously so that a logical value of the test input is latched in response to the next clock pulse.

* * * * *